(12) United States Patent
Dai et al.

(10) Patent No.: US 7,326,514 B2
(45) Date of Patent: Feb. 5, 2008

(54) ORGANOELEMENT RESISTS FOR EUV LITHOGRAPHY AND METHODS OF MAKING THE SAME

(75) Inventors: Junyan Dai, Ithaca, NY (US); Christopher K. Ober, Ithaca, NY (US); Lin Wang, Baton Rouge, LA (US); Franco Cerrina, Madison, WI (US); Paul Nealey, Madison, WI (US)

(73) Assignees: Cornell Research Foundation, Inc., Ithaca, NY (US); University of Wisconsin-Madison, Madison, WI (US)

( * ) Notice: Subject to any disclaimer, the term of this patent is extended or adjusted under 35 U.S.C. 154(b) by 286 days.

(21) Appl. No.: 10/800,195

(22) Filed: Mar. 12, 2004

(65) Prior Publication Data

US 2004/0241574 A1    Dec. 2, 2004

Related U.S. Application Data

(60) Provisional application No. 60/454,062, filed on Mar. 12, 2003.

(51) Int. Cl.
*G03C 1/73* (2006.01)
*G03F 7/038* (2006.01)
*G03F 7/039* (2006.01)

(52) U.S. Cl. .................. 430/270.1; 430/905
(58) Field of Classification Search ........... 430/270.1, 430/905, 313
See application file for complete search history.

(56) References Cited

U.S. PATENT DOCUMENTS

| | | | | |
|---|---|---|---|---|
| 3,816,380 A | * | 6/1974 | Reed, Jr. ................. | 526/215 |
| 4,638,092 A | * | 1/1987 | Ritter ..................... | 568/1 |
| 4,764,247 A | * | 8/1988 | Leveriza et al. .......... | 438/725 |
| 5,247,023 A | * | 9/1993 | Chung et al. ............. | 525/288 |
| 5,286,800 A | * | 2/1994 | Chung et al. ............. | 525/288 |
| 5,290,397 A | * | 3/1994 | Ober et al. ............... | 216/48 |
| 5,304,453 A | * | 4/1994 | Lin ........................ | 430/252 |
| 5,386,006 A | * | 1/1995 | Matsumoto et al. ....... | 528/4 |
| 5,616,649 A | * | 4/1997 | Kotani et al. ............. | 525/56 |
| 5,989,776 A | * | 11/1999 | Felter et al. ............. | 430/270.1 |
| 6,482,566 B1 | | 11/2002 | Hofer et al. | |
| 6,492,259 B2 | | 12/2002 | Dirahoui et al. | |

FOREIGN PATENT DOCUMENTS

| GB | 1229066 | * 4/1971 |
|---|---|---|
| JP | 62280839 | * 12/1987 |

OTHER PUBLICATIONS

Chemical Abstract 108:213981 (English abstract for JP 62280839).*
Dai et al ("Synthesis and Evaluation of Novel Organoelement Resists for EUV Lithography", Proceedings of SPIE, vol. 5039 (2003), p. 1164-1172).*
Chung et al ("Metallocene-Mediated Olefin Polymerization with B-H Chain Transfer Agents: Synthesis of Chain-End Functionalized Polyolefins and Diblock Copolymers", Macromolecules, vol. 34 (2001), p. 8040-8050).*
Gabor et al ("Hydrosiloxane Modified Styrene-Diene Block Copolymer Resists", Proceedings of SPIE, vol. 1925 (1993), p. 499-506).*
Dai et al. "Organoelement resists for EUV lithography," *SPIE The International Society for Optical Engineering* 4690:1193-1202 (2002).

* cited by examiner

*Primary Examiner*—Sin Lee
(74) *Attorney, Agent, or Firm*—Myers Bigel Sibley & Sajovec

(57) ABSTRACT

Resist compositions containing silicon, boron, or both silicon and boron may be used with ultra-violet lithography processes and extreme ultra-violet (EUV) lithography processes to increase the reactive ion etch resistance of the resist compositions, improve transmission of the resist materials, and to dope substrates.

11 Claims, 10 Drawing Sheets

(a)

(b)

(c)

(d)

a  b a  b

US 7,326,514 B2

ORGANOELEMENT RESISTS FOR EUV LITHOGRAPHY AND METHODS OF MAKING THE SAME

CROSS-REFERENCE TO RELATED APPLICATIONS

This application claims the benefit of, and incorporates herein by reference in its entirety, the following U.S. Provisional Application No. 60/454,062, filed Mar. 12, 2003.

FIELD OF THE INVENTION

The present invention relates materials for use with lithography, and more particularly to organoelement materials that may be used with lithography processes involving Extreme Ultra-Violet (EUV) radiation.

BACKGROUND OF THE INVENTION

Lithographic processes are used extensively in the manufacture and fabrication of semiconductor devices, integrated circuits, and microelectronic devices. As a result, new methods and materials are being developed for use in lithography processes everyday. At the same time, however, semiconductor devices, integrated circuits, and microelectronic devices are being miniaturized. This miniaturization strains the existing lithography technologies and requires the development of new technologies cable of producing smaller devices.

To date, extreme ultra-violet (EUV) lithography is one of the most promising next generation lithography technologies that may be used with devices having nanoscale or sub-250 nm features. SUV lithography may also be used to further push the limits of miniaturization. The goal of EUV lithography has been to create lithography capable of handling a sub-50 nm node. However, the use of EUV lithography has been limited by the absence or lack of materials that can be used in the EUV lithography processes. For instance, a lack of resist materials capable of withstanding currently used etching techniques is problematic.

In photolithography and EUV lithography feature size is ultimately limited by the wavelength of the exposing radiation. EUV radiation at a wavelength of 13.4 nm is believed to be the choice for next generation lithography processes because it should be able to produce features at the sub-50 nm level. Resist transparency is a key challenge for the technology. Absorption control is another challenge. At the narrow wavelengths of EUV lithography, absorption depends on the atomic composition of a material. However, many materials have high absorption levels and the current resist materials used in lithography processes are not suitable for EUV lithography processes. Furthermore, many of the resist materials used in lithography processes include large amounts of oxygen and fluorine, which are high absorbing elements that may not be suitable for use with EUV lithography processes and especially those processes involving sub-50 nm feature sizes.

Therefore, it is desirable to create new materials and processes that may be used with lithography and especially EUV lithography processes.

SUMMARY OF THE INVENTION

Embodiments of the present invention relate to organoelement materials and more particularly to polymer materials. The polymer materials of the present invention may be used as lithography materials and particularly as lithographic resist materials. In addition, the polymer materials of the present invention may be used with Extreme Ultra-Violet (EUV) lithographic processes. Embodiments of the present invention also relate to methods for forming the polymer materials of the present invention and methods for using the polymer materials in lithographic processes.

According to embodiments of the present invention, a polymer material for use with lithographic processes may include silicon. The inclusion of silicon in the polymer may provide characteristics to the polymer that are desirable for EUV lithography processes, such as reduced ion reactive etch rates and improved transmission characteristics.

Embodiments of the present invention also include boron-containing polymer materials for use with lithography processes. Boron may be incorporated into a polymer, such as a polymer resist material, to alter the characteristics of the polymer material; In particular, the inclusion of boron in a polymer material may improve the oxygen ion reactive etch resistance of the polymer and improve the transmission characteristics of the polymer.

In other embodiments of the present invention, the boron-containing polymers may be used as a resist material for lithography processes as well as a dopant material. For instance, a copolymer including a boron-containing resist material may be used to dope a substrate on a nanometer scale after self-assembly and doping procedures are performed.

Embodiments of the present invention also involve controlling the molecular weights of the polymer materials formed according to the present invention. Control of the molecular weight of the polymers of the present invention provides methods by which the lithographic properties of the polymer materials may be altered.

According to other embodiments of the present invention, a silicon-containing polymer material may be formed through polymerization reactions, such as through free-radical polymerization or living anionic polymerization.

Embodiments of the present invention also include methods for incorporating boron into a polymer to form boron-containing polymers. According to some embodiments, boron may be introduced into a polymer using a hydroboration reaction. In other embodiments, esterification reactions may be used to incorporate boron into a polymer. In addition, the amount of boron incorporated into a polymer may be adjusted by controlling the amount of boron used during an esterification reaction.

In still other embodiments of the present invention, methods for improving the reactive ion etch resistance of a polymer are provided. The reactive ion etch resistance of a polymer may be improved by incorporating silicon, boron, or a combination thereof into the polymer. For example, silicon or boron may be incorporated into a polymer according to embodiments of the present invention in order to improve the oxygen reactive ion etch resistance of the polymer.

Other embodiments of the present invention include silicon and/or boron containing resist compositions that include not more than 14 percent by weight oxygen and/or fluorine. In still other embodiments, the silicon and/or boron containing resist compositions of the present invention may include no oxygen and/or fluorine.

According to other embodiments of the present invention, methods for forming features on a substrate may be improved by forming a feature from a resist composition comprising a polymer wherein the improvement comprises including at least one element selected from the group consisting of boron and silicon in said polymer. The feature may have at least one dimension less than 100 nm, or less than 75 nm, or preferably less than 50 nm.

BRIEF DESCRIPTION OF THE DRAWING FIGURES

The invention can be more readily ascertained from the following description of the invention when read in conjunction with the accompanying drawings in which.

DETAILED DESCRIPTION OF THE INVENTION

Figure 1:
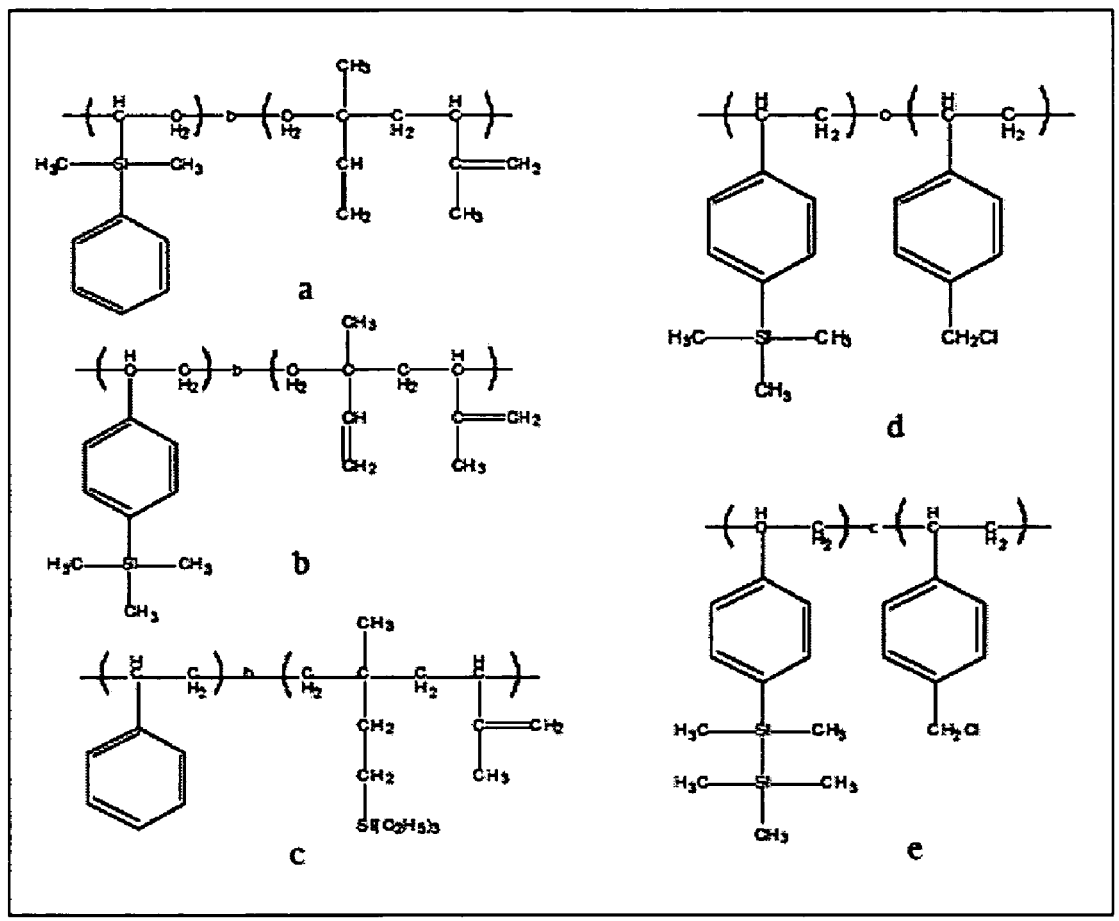
FIG. 1 illustrates structures of various silicon-containing resist compositions according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein.

As used herein, the term "polymer" means and includes any substance formed from the repetition of one or more molecules and includes, but is not limited to monomers, copolymers, terpolymers, and block copolymers.

The terms "Extreme Ultra-Violet lithography" or "EUV lithography" mean and include lithography that uses extreme ultraviolet radiation having a wavelength in the range of 10 to 100 nanometers (nm) to carry out projection imaging.

The terms "reactive ion etching" refer to the selective removal of materials from a substrate utilizing species reactive with the material that are desired to be removed, such as by using a plasma or gas of $O_2$, $CF_4$, and/or $CHF_3/O_2$.

The term "substrate" means and includes a material surface, including, but not limited to ceramic substrates, metallic substrates, semiconductive substrates, silicon substrates, substrates used in the fabrication of microelectronic devices or integrated circuits, nanoscale surfaces, and nanoscale devices.

Lithography

Lithography processes are commonly used in the fabrication of semiconductor materials and microelectronic devices. As the demand for smaller sized devices increases, new methods for creating smaller devices have been developed. Extreme Ultra-Violet (EUV) lithography processes are one example of the new methods that have been developed in response to such demands.

In photolithography, feature size may be limited by the wavelength of the exposing radiation. EUV lithography provides the ability to decrease wavelengths and is expected to produce feature sizes that are less than 75 nm and, in some instances, smaller than 50 nm. The absorption of the materials used in EUV lithography processes is a key area of concern when designing EUV lithography processes. The absorption is generally dependent upon the atomic structure of a material. As the wavelengths used in lithography processes are reduced, the absorption of resist materials is important to the production of smaller features.

Lithography processes and EUV lithography processes are known and used for the fabrication of semiconductor devices, microelectronic devices, and nanoscale devices. Methods and equipment used in lithography and EUV lithography processes are described, for example, in U.S. Pat. Nos. 5,978,441; 6,031,598; 6,387,785; 6,486,074; 6,593,041; and 6,607,862, the disclosures of which are incorporated herein by reference.

Silicon Containing Resist Compositions

Embodiments of the present invention relate to organoelement materials that may be used in lithography processes and preferably in lithography processes such as EUV lithography processes. More particularly, embodiments of the present invention relate to organoelement materials comprising low absorbing elements, such as hydrogen (H), carbon (C), silicon (Si), and boron (B), and methods for synthesizing low absorbing materials for use as resist compositions for lithography processes.

According to embodiments of the present invention, silicon may be incorporated into a resist polymer to form a low-absorbing composition that may be used as a resist composition. The inclusion of silicon in a resist composition provides the benefits associated with embodiments of the present invention. In some embodiments, the amount of silicon incorporated into the resist polymer may vary, such as between about 0.1 and about 40 percent by weight or between about 1.8 to about 19.8 percent by weight. In other embodiments, the inclusion of any amount of silicon in the resist is beneficial.

Block and random silicon-containing polymers of the present invention may be used as resist compositions with lithography processes and especially with EUV lithography processes. The incorporation of silicon into a resist polymer improves the etch resistance of the resist polymer and particularly the etch resistance with respect to oxygen and fluorine.

Silicon-containing polymers according to embodiments of the present invention may be formed by the copolymerization of silicon-containing monomers with resist polymers. The formation of silicon-containing monomers with resist polymers may include the free radical polymerization of a silicon-containing monomer and a resist polymer. For example, a silicon-containing styrene monomer may be polymerized with a non-silicon-containing styrene monomer by free radical polymerization to form a silicon-containing resist composition of the present invention. Silicon-containing styrene monomers that may be used with embodiments of the present invention include, but are not limited to, compositions such as poly(trimethylsilylstyrene) and poly(pentamethyldisilylstyrene). Other silicon-containing monomers may also be polymerized by free radical polymerization to form silicon-containing resist compositions according to embodiments of the present invention. Non-silicon containing polymers used with embodiments of the present invention may include, but are not limited to, vinyl polymers, styrene polymers, and isoprene polymers.

Some examples of silicon-containing resist materials formed by free radical polymerization include silicon-containing polymers having the following structures:

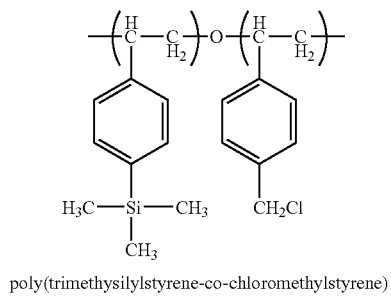

poly(trimethysilylstyrene-co-chloromethylstyrene)

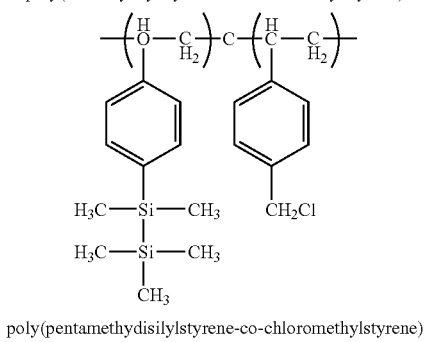

poly(pentamethydisilylstyrene-co-chloromethylstyrene)

Silicon-containing resist compositions according to other embodiments of the present invention may be formed by the living anionic polymerization of a silicon-containing monomer with a non-silicon containing monomer. For example, a silane may be copolymerized with a resist polymer, such as an isoprene polymer, by living anionic polymerization to form a silicon-containing resist composition. Silanes that may be used as silicon-containing monomers with embodiments of the present invention include, but are not limited to, dimethylphenylvinylsilane, dimethylphenylsilane, triethylsilane, and dimethylethylsilane. Living anionic polymerizations between silylstyrenes, such as poly(trimethylsilylstyrene), and non-silicon-containing monomers may also produce silicon-containing resist compositions according to embodiments of the present invention. The non-silicon containing polymers may include, but are not limited to, vinyl polymers, styrene polymers, and isoprene polymers.

Examples of silicon-containing resist compositions formed by living anionic polymerization reactions according to embodiments of the present invention include silicon-containing resist compositions having the following structures:

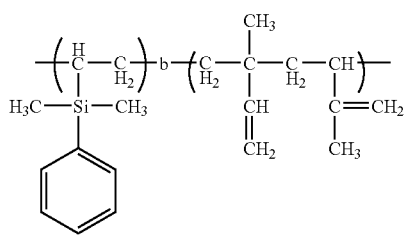

poly(dimethylphenylvinylsilane-b-isoprene)

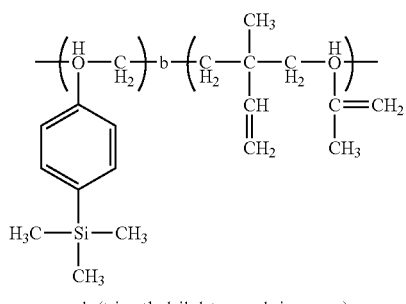

poly(trimethylsilylstyrene-b-isoprene)

In addition, the polystyrene resist compositions according to embodiments of the present invention may include protecting groups. For example, a silicon-containing polystyrene according to embodiments of the present invention, such as poly(trimethylsilylstyrene-co-hydroxystyrene) or poly(pentamethy-disilylstyrene-co-chloromethylstyrene), may include one or more protecting groups R as illustrated by the following structures:

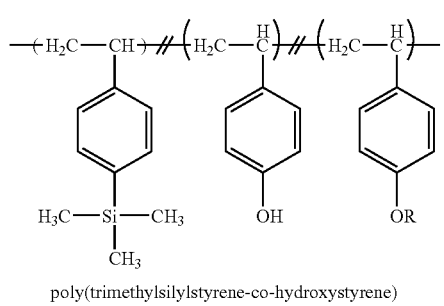

poly(trimethylsilylstyrene-co-hydroxystyrene)

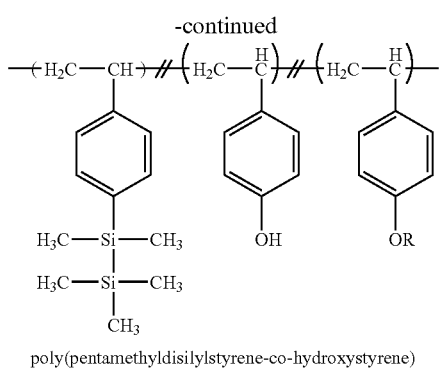

poly(pentamethyldisilylstyrene-co-hydroxystyrene)

The protecting groups R may include silicon-containing or non-silicon-containing protecting groups, hydroxy-functional groups, and acid or acid labile groups. For instance, protecting groups that may be used with embodiments of the present invention include trialkysilyl groups, trimethylsilyl groups, methoxyethylmethyl groups and t-butyloxycarbonyl groups. Some preferred protecting groups include trialkylsilyl, trimethylsilane, ethoxylmethyl, and t-butyloxycarbonyl.

In other embodiments of the present invention, silicon may be incorporated into a resist polymer through a hydrosilylation reaction of a resist polymer with a silicon-containing monomer. The resist polymer may include any polymer resist material used with lithography processes and especially with EUV lithography processes. For instance, the resist polymer may be selected from isoprene polymers, styrene polymers, and vinyl polymers. Silicon-containing monomers that may be used as hydrosilylation agents for the hydrosilylation reactions include, but are not limited to, silanes such as dimethylphenylsilane, triethylsilane, and dimethylethylsilane.

Examples of silicon-containing resist materials formed by hydrosilylation reactions include polymers such as silicon-containing poly(styrene-b-isoprene) polymers as represented by the following structure:

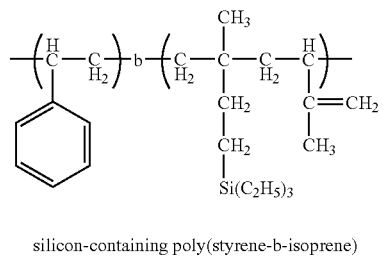

silicon-containing poly(styrene-b-isoprene)

The silicon-containing resist compositions of embodiments of the present invention exhibit improved oxygen reactive ion etch resistance as compared to other resist materials. In addition, the fluorocarbon reactive ion etch resistance of the resist compositions can be improved by the incorporation of silicon into the resist compositions. Further, silicon-containing resist compositions according to embodiments of the present invention exhibit a high transparency at EUV lithography wavelengths.

Boron Containing Resist Compositions

According to other embodiments of the present invention, a low-absorbing material that can be used in lithography processes includes polymer materials having boron incorporated therein.

Boron may be incorporated into a polymer according to embodiments of the present invention to form a boron-containing resist composition for use in lithography processes and particularly in EUV lithography processes. The incorporation of boron into a resist composition improves the etch resistance of the resist composition and particularly the etch resistance with respect to oxygen. The incorporation of boron also improves the transparency of a resist material.

Boron-containing resist compositions according to embodiments of the present invention may be formed by the hydroboration of a polymer. For example, a hydroboration agent may be reacted with a polymer or block copolymer to cause the hydroboration of the polymer, forming a boron-containing polymer structure. The polymer or block copolymer used with the hydroboration reaction may include, but is not limited to, isoprene polymers, styrene polymers, vinyl polymers, poly(styrene-b-isoprene) polymers, hydroxylated poly(styrene-b-isoprene) polymers, poly(styrene-b-hydroxystyrene) polymers, and poly(α-methylstyrene-b-hydroxystyrene) polymers.

Many organoboron compounds are known to be unstable and they may easily undergo oxidation and hydrolysis. The instability of hydroboration agents may prevent their use in boron-containing resist compositions. Therefore, hydroboration agents that exhibit some stability are preferably used with embodiments of the present invention. For example, compounds such as dimesitylborane show better stability than other hydroboration compounds. The mesityl group of dimesitylborane can stabilize the boron atom due to its steric hindrance and conjugation. Thus, boron-containing resist compositions formed using dimesitylborane as a hydroboration agent are stable during short exposures to air and can be maintained under inert atmospheres, such as nitrogen, for months.

An example of a boron-containing resist composition formed by hydroboration using dimesitylborane according to embodiments of the present invention includes a boron-containing poly(styrene-b-isoprene) having the following structure:

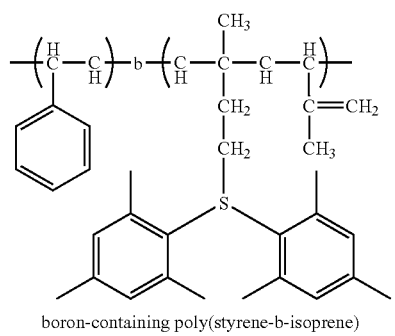

boron-containing poly(styrene-b-isoprene)

Boron-containing resist compositions formed by hydroboration may include relatively small amounts of boron due to the steric hindrance of the hydroboration agent used. For instance, a boron-containing poly(styrene-b-isoprene) formed with dimesitylborane according to embodiments of the present invention may be limited to only about 10 percent or less according to NMR. The use of other hydroboration agents, however, may increase the amount of hydroboration achieved.

According to other embodiments of the present invention, boron-containing resist compositions may be formed by the attachment of a carborane structure to a polymer. For example, a carborane structure may be attached to a polymer by esterification. An esterification reaction may be used to attach a carborane carboxylic acid, or other carborane, to a polymer, such as a block copolymer backbone. For instance, a carborane carboxylic acid may be reacted with a hydroxylated block copolymer to form a boron-containing resist material. The hydroxylated block copolymer may include, but is not limited to, vinyl polymers, isoprene polymers, styrene polymers, poly(styrene-b-isoprene) polymers, hydroxylated poly(styrene-b-isoprene) polymers, poly(styrene-b-hydroxystyrene) polymers, and poly(α-methylstyrene-b-hydroxystyrene) polymers.

An example of a boron-containing resist composition formed by the esterification of a hydroxylated block copolymer with a carborane carboxylic acid is a boron-containing poly(styrene-b-isoprene) having the structure:

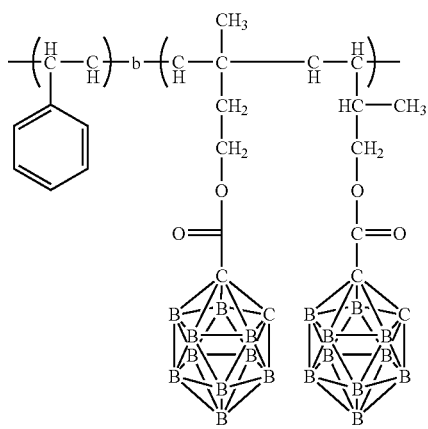

boron-containing hydroxylated poly(styrene-b-isoprene)

Carborane is a cage-structured borane that is inert toward oxygen and water due to its aromatic nature.

According to still other embodiments of the present invention, the amount of boron contained in a boron-containing resist composition formed by the attachment of a carborane structure to a polymer may be controlled by limiting the amount of boron reacted with the polymer. The attachment of a carborane group to a polymer may be controlled from 0 to about 100 percent. Thus, the boron concentration in a resist composition may be tuned or controlled from ten boron atoms to $2 \times 10^{22}$ boron atoms per cubic centimeter. The ability to control the amount of boron attached to a resist composition may also be used to control subsequent doping of a substrate to which the boron-containing resist composition is applied.

An example of a resist material that may still accept carborane is a hydroxylated poly(styrene-b-isoprene) that has been partially reacted with carborane as shown by the following structure:

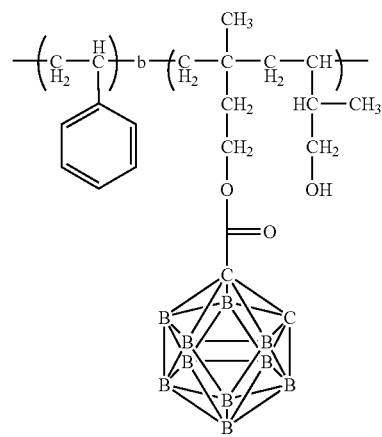

boron-containing hydroxylated poly(styrene-b-isoprene)

The structure includes a hydroxy group to which an additional carborane groups could be reacted.

According to other embodiments of the present invention, boron-containing resist materials may also be used as dopants. Boron is a p-type dopant for silicon. Block copolymers are known to self-assemble to different periodic nanostructures depending upon the molecular weight and volume ratio of the blocks. A copolymer composed of a boron-containing resist material may dope a substrate on a nanometer scale after self-assembly and doping procedures are carried out. Because the typical domain size is on the order of about 10 nm and doping on such a size scale is not readily achievable, the boron-containing resist compositions of embodiments of the present invention could be used to perform such doping.

In some embodiments of the present invention, a boron-containing resist composition including carborane may be used to dope a substrate because the high boron concentration of carborane may help to dope the substrate.

In other embodiments of the present invention, resist compositions may include resist compositions having a low-percentage of high absorbing materials such as oxygen ($O_2$) and fluorine (F). A silicon or boron-containing resist composition according to embodiments of the present invention may include reduced amounts of a high absorbing material. For example, the amount of high absorbing materials may be limited to below about 14 percent by weight.

The resist compositions of the present invention may also include other components as generally used with resist compositions. For example, a silicon and/or boron-containing resist material may also include photoacid generators and initiators. According to embodiments of the present invention, the resist compositions may be either positive-tone resists or negative-tone resists. Positive-tone resists can be decomposed by EUV and removed after exposure and development. Negative-tone resists can be hardened by EUV and remains on a substrate after exposure and development.

According to other embodiments of the present invention, methods for forming features on a substrate may be improved by forming a feature from a resist composition comprising a polymer wherein the improvement comprises including at least one element selected from the group consisting of boron and silicon in the polymer. The feature may have at least one dimension less than 100 nm, or less than 75 nm, or preferably less than 50 nm. The polymer may include a silicon or boron-containing resist composition according to embodiments of the present invention.

Silicon-containing and boron-containing resist compositions according to embodiments of the present invention were synthesized and tested. The following Examples illustrate several of the resist compositions and methods of making the resist compositions according to embodiments of the present invention. The Examples, however, are not meant to be limiting:

EXAMPLE 1

Formation of poly(dimethylphenylvinylsilane-b-isoprene)

Dimethylphenylvinylsilane and isoprene were distilled from $CaH_2$ and dibutylmagnesium successively under high vacuum prior to use. Toluene was dried by distillation from $CaH_2$ and degassed three times prior to its use as a solvent. The poly(dimethyl-phenylvinylsilane-b-isoprene) was synthesized by living anionic polymerization using standard high vacuum techniques. The polymerization was initiated by s-Butyl lithium and was quenched with anhydrous methanol.

EXAMPLE 2

Formation of poly(trimethylsilylstyrene-b-isoprene)

Trimethylsilylstyrene was synthesized and then distilled successfully from $CaH_2$ and dibutylmagnesium under a high vacuum. Poly(trimethylsilylstyrene-b-isoprene) was synthesized by living anionic polymerization of the distilled trimethylsilylstyrene with isoprene in tetrahydrofuran using standard high vacuum techniques.

EXAMPLE 3

Formation of poly(trimethysilylstyrene-co-chloromethylstyrene)

Numerous samples of poly(trimethylsilylstyrene-co-chloromethylstyrene) having different compositions were synthesized by the free radical polymerization of trimethylsilylstyrene and chloromethylstyrene in tetrahydrofuran using azobisisobutyronitrile (AIBN) as an initiator. The polymerizations were performed at 65° C. The polymer solution was precipitated in methanol, re-dissolved in tetrahydrofuran, and then re-precipitated in methanol. The samples were dried in vacuo overnight.

EXAMPLE 4

Formation of poly(pentamethydisilylstyrene-co-chloromethylstyrene)

Numerous samples of poly(pentamethydisilylstyrene-co-chloromethylstyrene) having different compositions were synthesized by the free radical polymerization of pentamethydisilylstyrene and chloromethylstyrene in tetrahydrofuran using AIBN as an initiator. The polymerizations were performed at 65° C. The polymer solution was precipitated in methanol, re-dissolved in tetrahydrofuran, and then re-precipitated in methanol. The samples were dried in vacuo overnight.

EXAMPLE 5

Hydrosilylation of poly(styrene-b-isoprene)

Varying silicon-containing poly(styrene-b-isoprene) compositions were prepared by hydrosilylation of poly(styrene-b-isoprene) using different silanes as hydrosilylation agents. The silanes included dimethylphenyl silane, triethylsilane, and dimethylethylsilane. The hydrosilylation was performed by typical hydrosilylation procedures.

A typical hydrosilylation reaction is described: 1.9 grams of poly(styrene-b-isoprene) (14.3 mmol vinyl group) having a molecular weight between about 5500 and 5700 were dissolved under nitrogen in a 50 ml flask and added to a 100 ml three neck flask. The solution was heated to 85° C. After one hour, 30 µl of a platinum-1,3, divinyl-1,1,3,3-tetramethyldisiloxane (Pt-DTD) complex was added. After equilibrium for 24 hours, 2.3 ml (15 mmol) of dimethylphenylsilane was added to the flask. A reaction was allowed to proceed for an additional 24 hours. The reaction was then stopped by cooling to room temperature. The mixture was filtered, concentrated, and precipitated in 400 ml of methanol. The precipitated polymer was re-dissolved in toluene, re-precipitated in methanol and dried in vacuo overnight.

EXAMPLE 6

Formation of poly(trimethylsilylstyrene-co-hydroxystyrene)

Trimethylsilylstyrene was synthesized using known procedures and the final product was distilled three times before use. The trimethylsilylstyrene product was dissolved with acetoxystyrene in tetrahydrofuran. 5 mol percent AIBN was added to the solution as an initiator. The mixture was degassed before heat was applied by an oil bath. The reaction was carried out in an oil bath at a temperature between about 65° C. and 70° C. for 24 hours. Methanol (100 ml) and ammonia hydroxide (30 ml) were added to the reaction mixture. The mixture was allowed to reflux for 48 hours. The mixture was then concentrated and precipitated in water with acetic acid (30 ml). The poly(trimethylsilylstyrene-co-hydroxystyrene) polymer was collected and re-dissolved in acetone and re-precipitated twice. The polymer was then protected by different protecting groups, including t-butyloxycarbonyl, trimethyl silane, and ethoxymethyl.

EXAMPLE 7

Formation of poly(pentamethydisilylstyrene-co-chloromethylstyrene)

Pentamethyldisilylstyrene was synthesized using known procedures and the final product was distilled three times before use. The pentamethyldisilylstyrene product was dissolved with acetoxystyrene in tetrahydrofuran. 5 mol percent AIBN was added to the solution as an initiator. The mixture was degassed before heat was applied by an oil bath. The reaction was carried out in an oil bath at a temperature between about 65° C. and 70° C. for 24 hours. Methanol (100 ml) and ammonia hydroxide (30 ml) were added to the reaction mixture. The mixture was allowed to reflux for 48 hours. The mixture was then concentrated and precipitated in water with acetic acid (30 ml). The poly(pentamethydisilylstyrene-co-chloromethylstyrene) polymer was collected and re-dissolved in acetone and re-precipitated twice. The polymer was then protected by different protecting groups, including t-butyloxycarbonyl, trimethyl silane, and ethoxymethyl.

EXAMPLE 8

Hydroboration of poly(styrene-b-isoprene)

Varying boron-containing poly(styrene-b-isoprene) compositions were prepared by hydroboration of poly(styrene-b-isoprene) using dimesitylborane as a hydroboration agent. The hydrosilylation was performed by typical hydrosilylation procedures.

A typical hydroboration reaction is described: 1 gram of poly(styrene-b-isoprene) (2.94 mmol vinyl group) was vacuum dried overnight at 55 ° C. in a 250 ml flask equipped with a Rotoflo stopcock and a septum. After cooling, freshly distilled tetrahydrofuran (20 ml) was added through a cannula. 0.5 grams of dimesitylborane (1.80 mmol) was dissolved in tetrahydrofuran (30 ml) in a glove box and transferred to the polymer solution via a cannula. The reaction mixture was heated to about 65° C. and stirred under nitrogen for 24 hours. The mixture was then precipitated in degassed anhydrous methanol. The polymer was re-dissolved in dry tetrahydrofuran, re-precipitated in methanol under a nitrogen atmosphere, and dried in vacuo overnight. The final dry polymer was stored in a glove box.

EXAMPLE 9

Esterification of 1-carboxyl Chloride with Block Copolymer Backbones

Carborane 1-carboxyl chloride was prepared from methyl carborane 1-carboxylate. The methyl carborane 1-carboxylate was prepared by forming a mixture of 3.6 grams decaborane (29.5 mmol) and 50 ml anhydrous acetonitrile. The mixture was stirred at room temperature for three hours. 3 ml of ethyl propiolate (29.5 mmol) was added to the mixture and the mixture was heated up to reflux and maintained for 48 hours. The acetonitrile was then removed under vacuum and the residue was purified by chromatography with chloroform as the eluent.

Carborane 1-carbocylic acid was prepared by the hydrolysis of the methyl carborane 1-carboxylate using a similar method. The final product was re-crystallized twice from pentane.

Carborane 1-carboxyl chloride was prepared from the carborane 1-carbocylic acid using known procedures.

The carborane 1-carboxyl chloride was attached to a poly(styrene-b-isoprene) block copolymer by an esterification reaction. 0.5 grams of a hydroxylated block copolymer of poly(styrene-b-isoprene) (0.97 mmol OH group) was dissolved in 20 ml anhydrous tetrahydrofuran. The solution was stirred overnight under a nitrogen atmosphere. The solution was then added dropwise to a suspension of 64 mg NaH (2.6 mmol) and 20 ml anhydrous tetrahydrofuran in an ice bath. The dropwise addition was performed over a period of 30 minutes. The mixture was allowed to warm up to room temperature and was stirred for one hour. 0.47 grams carborane 1-carboxyl chloride in 20 ml anhydrous tetrahydrofuran was then added dropwise to the mixture, which was in an ice bath. The mixture was then heated to reflux and held there for 48 hours. The mixture was then precipitated in a 300 ml mixture of water and methanol in a 1:1 ratio. The polymer was re-dissolved in tetrahydrofuran and re-precipitated in a water/methanol mixture. The polymer was collected and extracted with 95 percent ethanol using a Soxhlet extractor for 24 hours.

Silicon and boron-containing polymer samples formed according to embodiments of the present invention and Examples 1-9 were analyzed and tested to determine the characteristics and lithographic properties of the samples.

Numerous characteristics of the samples were obtained. GPC measurements of the molecular weights and weight distributions of samples made according to Examples 1-9 were performed using a size-exclusion chromatograph (SEC) equipped with a Waters 486 UV detector and 410 differential refractive index detector. Tetrahydrofuran was used as an eluent at 40° C. FT-IR measurements of the samples were carried out on a Mattson instrument. 1-HNMR measurements of the samples were performed using 400 Mhz Varian NMR instrunents. Thermal analysis of the samples was performed using a Perkin-Elmer DSC and SEIKO Thermo-Gravemetric Differential Thermal Analyzer (TGA). The bulk morphology of the block copolymers of the samples were examined using TEM and SAXS. The thin film morphology was measured by a Digital Instrument 3100 AFM.

The samples were also analyzed to determine the lithographic qualities of the polymers of the present invention. To perform the analysis, the sample polymers were spin-coated onto silicon substrates primed by a hexamethyldisilazane (HMDS) solution or vapor. Film thicknesses of the samples were measured using a Leitz MV-SP Spectrophotometer. EUV exposures of the samples were performed at the Synchrotron Radiation Center at the University of Wisconsin-Madison. Exposures at 248 nm were also performed at the Cornell Nanofabrication Center at Cornell University. Negative-tone resists were developed by a mixture of tetrahydrofuran/ethanol in a 40 percent by volume to 60 percent by volume ratio. Other resists were developed with a 0.263 N THAM solution. The imaged patterns were examined using a Leo Zeiss 982 SEM and Leo Zeiss 1550 VP SEM. Reactive ion etching of the samples was conducted on a plasma thermal 72 reactive ion etching system using various etching gases.

Various characteristics of some of the silicon-containing resist compositions of the present invention were determined using the methods previously described. In particular, silicon-containing polymers according to Examples 1-5 were tested to determine the molecular weights of the polymers, the weight distribution (PDI) of the polymers, the silicon mass content of the polymers, and the oxygen reactive ion etch rate of the polymers. The results of the tests are summarized in Table 1. Further, the structures of the polymers are illustrated in FIG. 1, wherein: polymer (a) is poly(dimethylphenylvinylsilane-b-isoprene) (Example 1); polymer (b) is poly(trimethylsilylstyrene-b-isoprene) (Example 2); polymer (c) is silicon-containing poly(styrene-b-isoprene) (Example 5); polymer (d) is poly(trimethysilyl-styrene-co-chloromethylstyrene) (Example 3); and polymer (e) is poly(pentamethydisilylstyrene-co-chloromethylstyrene) (Example 4). The silicon mass content of the polymers was calculated from polymers containing 75 mol percent silicon-containing groups.

TABLE 1

| Polymer | Molecular Weight | PDI | Silicon Weight Percent | Oxygen Reactive Ion Etch Rate (nm/s) |
|---|---|---|---|---|
| Polymer (a) | 17,800-22,100 | 1.04 | 9.57 | 0.34 |
| Polymer (b) | 10,700-28,700 | 1.13 | 11.6 | 0.35 |
| Polymer (c) | 5,500-5,700 | 1.06 | | |
| | 7,200-21,800 | 1.05 | | |
| Polymer (d) | 10,000-80,000 | ~1.5 | 12.3 | 0.18 |
| Polymer (e) | 11,000-100,000 | ~1.5 | 19.7 | 0.13 |

In Table 1, the molecular weights and weight distribution (PDI) of polymer (c) represent the molecular weight and weight distribution of the poly(styrene-b-iosprene) bases without any silicon content. The samples for polymers (d) and (e) included a series of polymers having different molecular weights. The oxygen reactive ion etch rates for each of the samples was calculated based upon the film thickness loss over a period of 60 seconds.

The data in Table 1 demonstrate the low oxygen reactive ion etch rate of the silicon-containing polymers of embodiments of the present invention. It is known that the oxygen reactive ion etch rate for Novolac resists under the same conditions is about 5.8 nm/s. The oxygen reactive ion etch rates for the silicon-containing polymers of the present invention are much lower than that of known Novolac resists, which indicates that the inclusion of silicon in a resist composition reduces the oxygen reactive ion etch rate of the resist composition.

Figure 2:
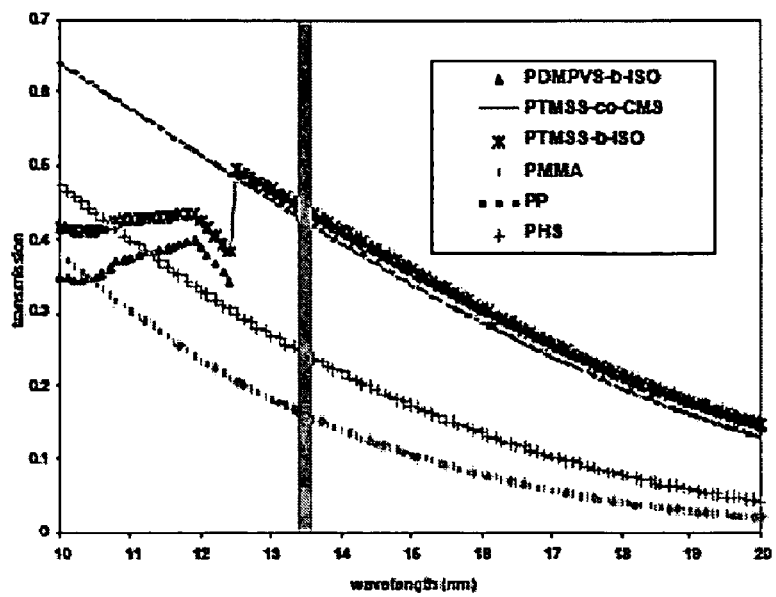
FIG. 2 illustrates transmission simulations of various silicon-containing polymers according to embodiments of the invention.

The transmission characteristics of the silicon-containing resist compositions of the present invention were also tested. The absorbance of a polymer at EUV wavelengths is dependent upon the atomic composition of the polymer. Therefore, the transmission of a polymer may be calculated if the atomic composition of the polymer, film thickness of the polymer, and the density of the polymer are known. The calculated transmission of polymer resist compositions according to Examples 1-3 of the present invention are compared to the calculated transmission of poly(hydroxystyrene) (PHS), poly(methyl methacrylate) (PMMA), and polypropylene (PP) in FIG. 2. In FIG. 2, the identification for the polymer resist composition of Example 1 is "PDMPVS-b-Iso," the identification for the polymer resist composition of Example 2 is "PTMSS-b-Iso," and the identification for the polymer resist composition of Example 3 is "PTMSS-co-CMS." The calculated transmission lines are based upon a 350 nm film thickness, are shown over the EUV range of wavelengths, and were calculated using the tools provided at http://www-cxro.lbl.gov/optical_constants/filter2.html.

Poly(hydroxystyrene) and poly(methyl methacrylate) are polymers that are used in many resist materials. The low transmission of poly(hydroxystyrene) and poly(methyl methacrylate) within the EUV wavelengths is due to the presence of oxygen atoms in those polymers. The low transmission is undesirable for EUV lithography. As illustrated in FIG. 2, the simulated transmission of the polymer resist compositions of Examples 1-3 exhibit higher transmissions than the poly(hydroxystyrene) and poly(methyl methacrylate). The higher transmissions of the resist compositions of Examples 1-3 indicate that the silicon-containing resist compositions of the present invention are better EUV lithography materials than poly(hydroxystyrene) and poly(methyl methacrylate). The polymer resist compositions even exhibit a similar or higher calculated transmission than polypropylene, which is a known EUV transparent material.

The EUV exposure behavior of various poly(trimethysilylstyrene-co-chloromethylstyrene) samples of Example 3 (PTMSS-co-CMS) and a sample of poly(pentamethydisilylstyrene-co-chloromethylstyrene) of Example 4 (PPMDSS-co-CMS) were also tested. Samples of different molecular weights having a fixed composition of 10 mol percent chloromethyl styrene were tested and the lithographic properties are shown in Table 2. The samples were tested using a mixture of tetrahydrofuran and methanol (45 volume percent to 55 volume percent) as a developer.

TABLE 2

| Polymer | Molecular Weight (kg/mol) | PDI | $D_o$ (mJ/cm$^2$) | $D_i$ (mJ/cm$^2$) | γ |
|---|---|---|---|---|---|
| PTMSS-co-CMS | 80 | 2.03 | 2.6 | 5.4 | 3.2 |
| PTMSS-co-CMS | 30 | 1.54 | 4.4 | 8.8 | 3.3 |
| PTMSS-co-CMS | 15 | 1.62 | 7.3 | 13.2 | 3.9 |
| PPMDSS-co-CMS | 11 | 1.65 | 6.4 | 16.9 | 2.4 |

Figure 3:
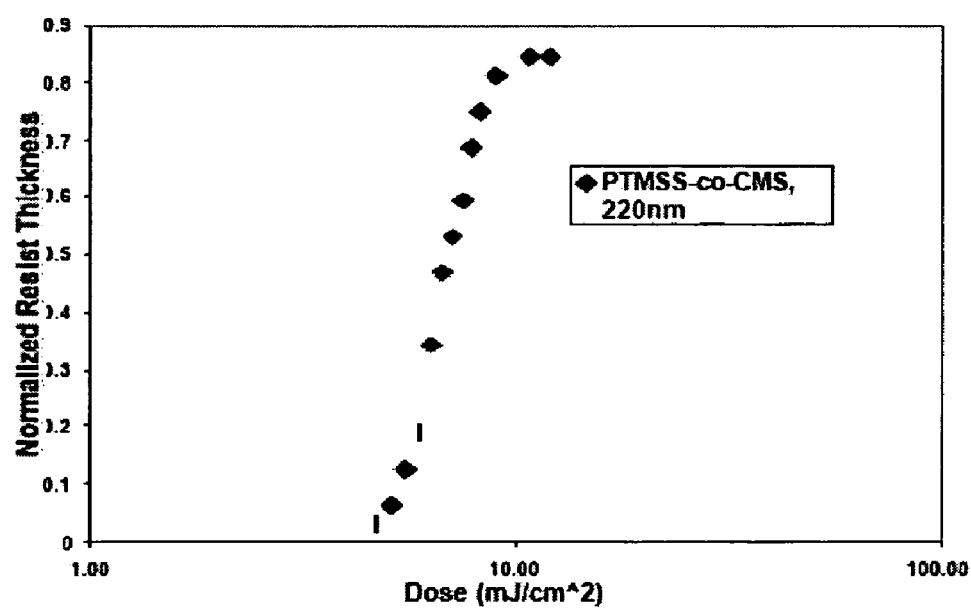
FIG. 3 illustrates a contrast curve of a silicon-containing resist composition according to embodiments of the present invention.

FIG. 3 illustrates a contrast curve of the poly(trimethysilylstyrene-co-chloromethylstyrene) having a film thickness of 220 nm.

Figure 4:
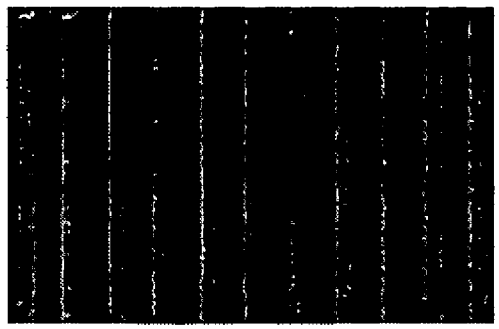
FIG. 4 illustrates scanning electron microscope images of various silicon-containing resist compositions according to embodiments of the present invention.
Figure 4:
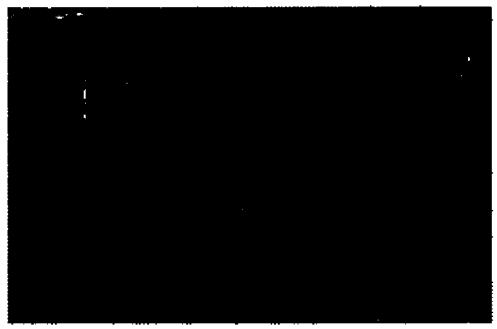
Figure 4:
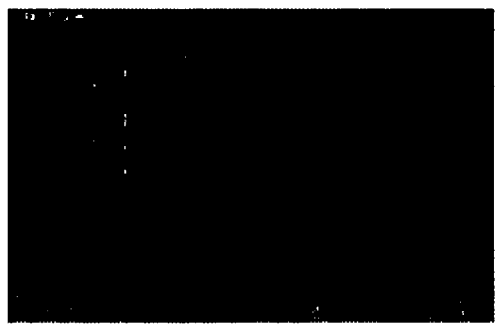
Figure 4:

FIG. 4 illustrates scanning electron microscope (SEM) images of silicon-containing polymers of the present invention. More particularly: FIG. 4(a) illustrates a SEM image with 180 nm lines/spaces of poly(trimethysilylstyrene-co-chloromethylstyrene) having a molecular weight of 10,000; FIG. 4(b) illustrates a SEM image with 180 nm lines/spaces of poly(trimethysilylstyrene-co-chloromethylstyrene) having a molecular weight of 15,000; FIG. 4(c) illustrates a SEM image with 180 nm lines/spaces of poly(pentamethydisilylstyrene-co-chloromethylstyrene) having a molecular weight of 11,000; and FIG. 4(d) illustrates a SEM image with 880 nm lines/spaces of poly(trimethylsilylstyrene-b-isoprene). Optical gratings with different pitches ranging from 2 μm to 360 nm were used as masks for the EUV exposures illustrated in FIG. 4.

The sensitivities of the silicon-containing resist compositions of the present invention illustrated in FIG. 4 are very high. The sensitivities of the silicon-containing resist compositions illustrated in FIGS. 4(a)-4(c) are particularly high due to the presence of the chloromethyl group. The sensitivity of the silicon-containing resist illustrated in FIG. 4(d) is lower than that of the other polymers illustrated in FIG. 4 due to the presence of a double bond in the crosslinking site instead of a chloromethyl group, however, the sensitivity is still high and useful for EUV lithography.

The data in Table 2 and the images of FIG. 4 also indicate that an increase in the molecular weight can help to enhance the sensitivity of a silicon-containing resist composition according to embodiments of the present invention. However, an increase in molecular weight of the resist composition also appears to decrease the resist contrast as illustrated by the images in FIG. 4.

Silicon-containing resist compositions formed in accordance with the procedures of Examples 6 and 7 were also tested and analyzed. In particular, silicon-containing polymers having the following structures were tested and studied:

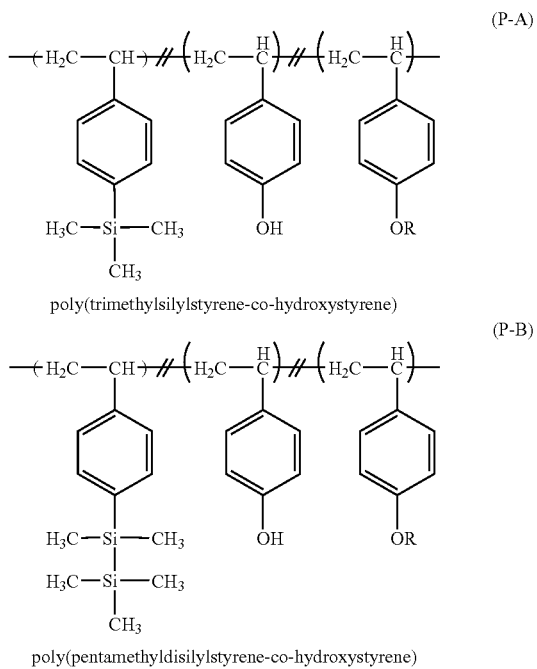

poly(trimethylsilylstyrene-co-hydroxystyrene) (P-A)

poly(pentamethyldisilylstyrene-co-hydroxystyrene) (P-B)

In each instance, the silicon-containing resist materials included t-butyloxycarbonyl protecting groups at the R position.

Figure 5:
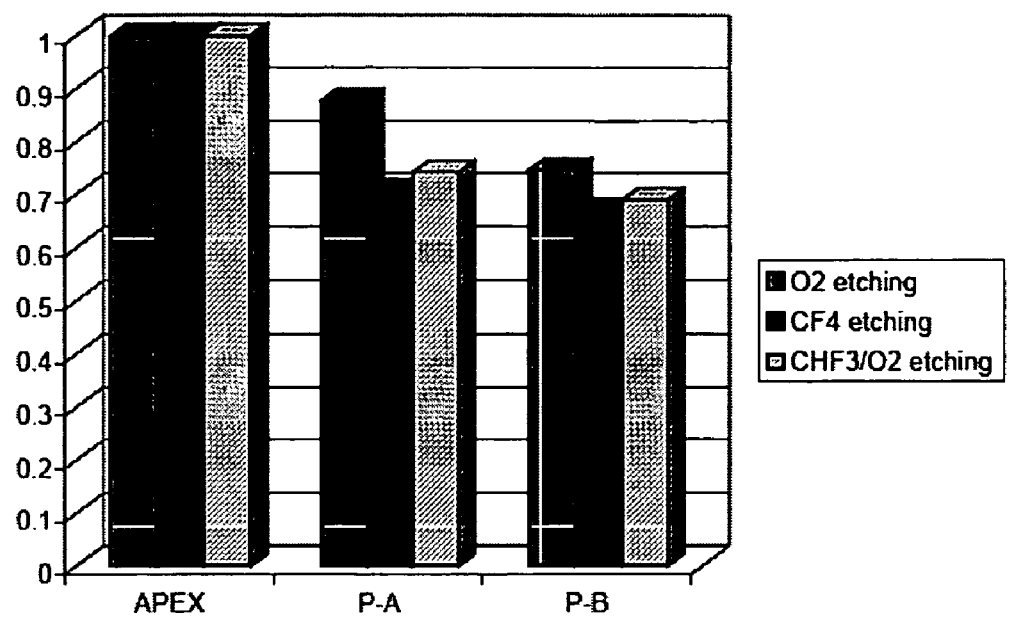
FIG. 5 illustrates a graph of the etch behavior of silicon-containing resist materials according to embodiments of the present invention.

The reactive ion etch rates of the samples of the silicon-containing resist compositions formed according to Examples 6 and 7 were tested and compared to a known resist material, APEX E, under varying etch conditions. The results are illustrated in FIG. 5, wherein P-A corresponds to the poly(trimethylsilylstyrene-co-hydroxystyrene) and P-B corresponds to poly(pentamethydisilylstyrene-co-chloromethylstyrene). As illustrated, both of the silicon-containing resist compositions of the present invention exhibit higher resistance to oxygen reactive ion etching and to etching with fluorocarbons and fluorocarbon/oxygen reactive ion etching. Thus, the silicon-containing resist compositions of the present invention are more resistant to different types of reactive ion etching than is APEX E.

Figure 6:
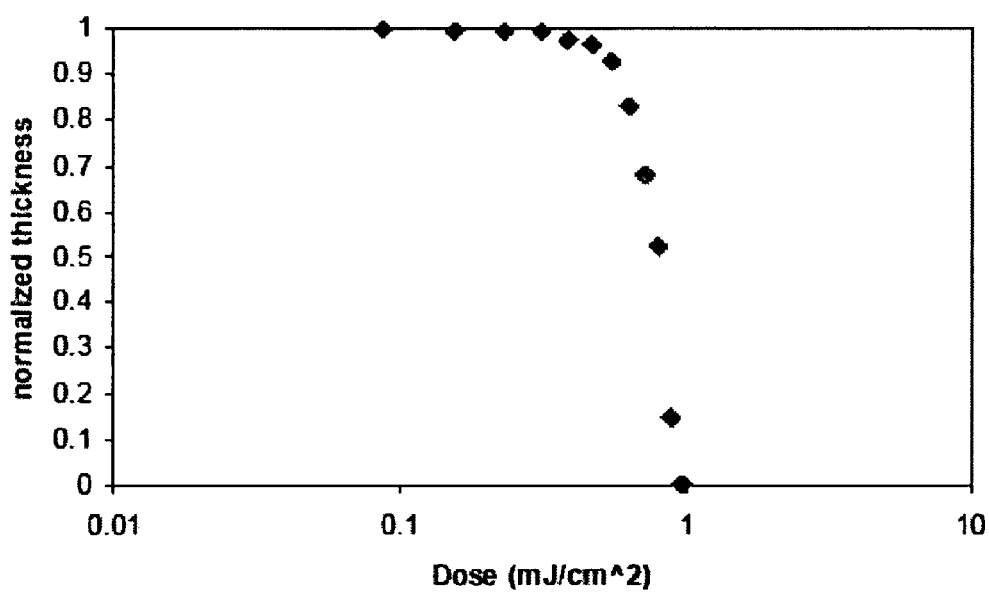
FIG. 6 illustrates a contrast curve of a silicon-containing resist composition according to embodiments of the present invention.

The EUV exposure sensitivity of the silicon-containing resist compositions was also determined. FIG. 6 illustrates a contrast curve of the positive tone silicon-containing resist composition poly(trimethylsilylstyrene-co-hydroxystyrene) having t-butyloxycarbonyl protecting groups. Trisulfonium triflate (5 weight percent) was used as a photoacid generator for the silicon-containing resist composition and the resist was baked at 115° C. before and after exposure. The contrast curve indicates that the silicon-containing resist has a very high sensitivity and a clearing dose of less than 1 mJ/cm$^2$.

Figure 7:
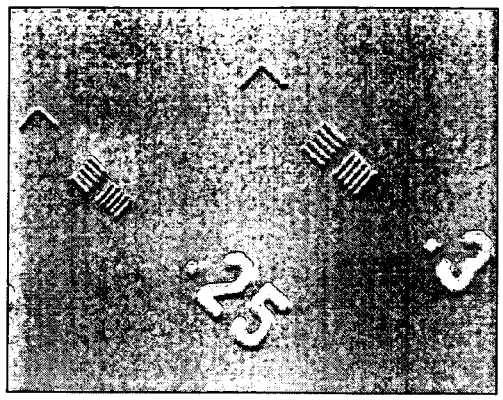
FIG. 7 illustrates scanning electron microscope images of silicon-containing resist compositions according to embodiments of the present invention.
Figure 7:
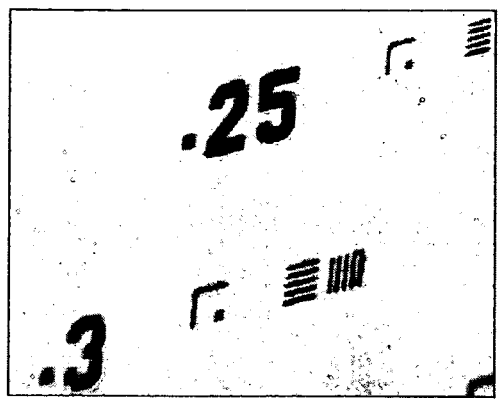

The silicon-containing resist compositions were also imaged. Both polymers were well imaged under 248 nm exposure. An example of the imaging is illustrated in FIG. 7, wherein both a bright field SEM image and a dark field SEM image for the silicon-containing resist composition poly(pentamethydisilylstyrene-co-chloromethylstyrene) are shown. As seen in those images, both the 250 nm and 300 nm feature sizes are clearly distinguishable.

Figure 8:
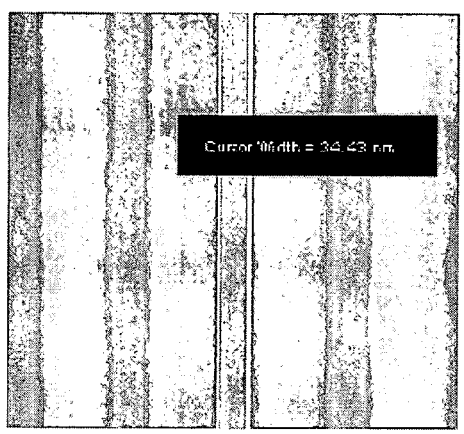
FIG. 8 illustrates scanning electron microscope images of silicon-containing resist compositions according to embodiments of the present invention that have been exposed using Lloyd Mirror Interferometry.
Figure 8:
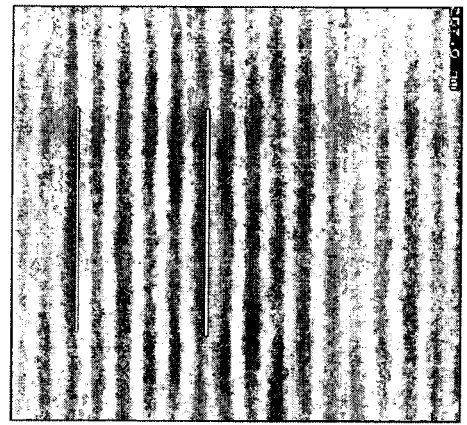
Figure 9:
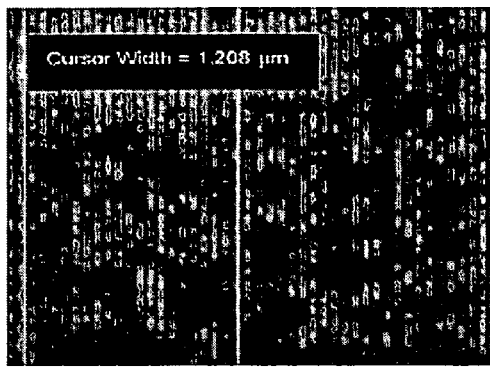
FIG. 9 illustrates scanning electron microscope images of silicon-containing resist compositions according to embodiments of the present invention that have been exposed using Grating Interferometry.
Figure 9:
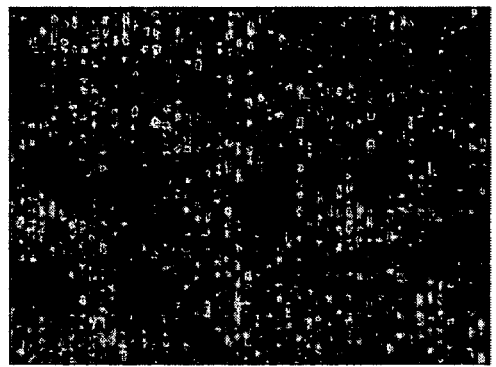
Figure 9:
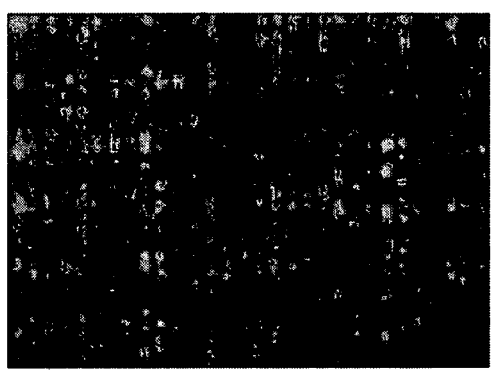
Figure 9:
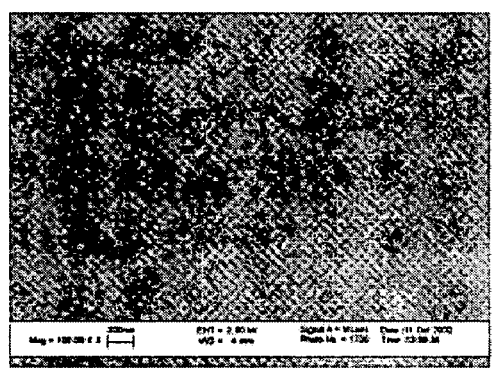

Further, sensitivities of the silicon-containing resist compositions were determined using Lloyd Mirror Interferometry and Grating Interferometry. The images illustrated in FIG. 8 show SEM images obtained by the Lloyd Mirror Interferometry methods and the images illustrated in FIG. 9 show SEM images obtained from Grating Interferometry. Each method is capable of showing sub-50 nm features.

Figure 10:
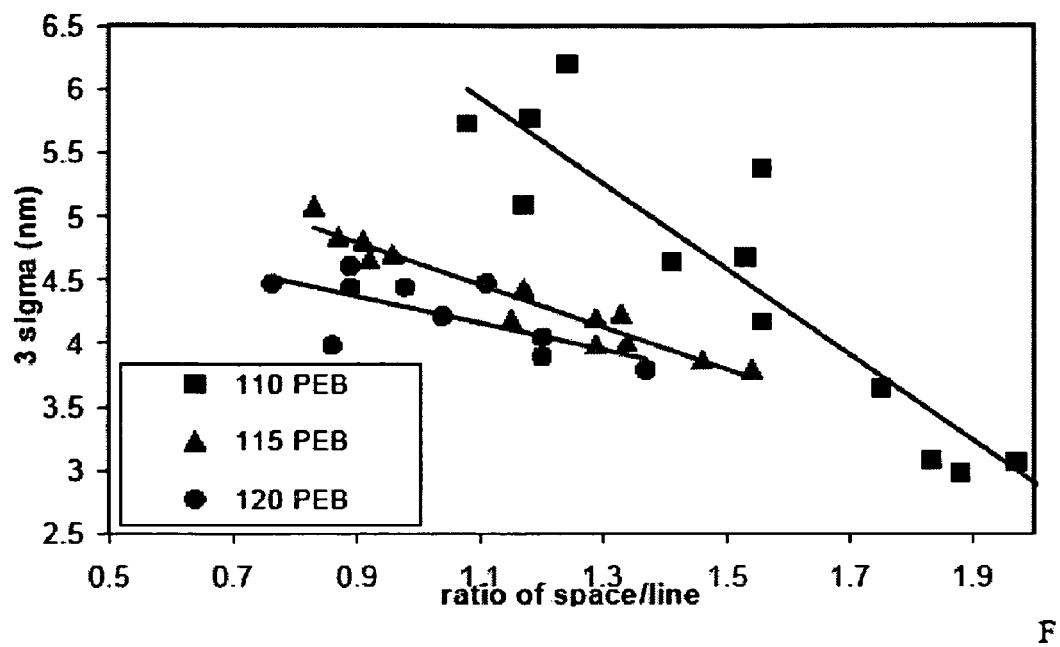
FIG. 10 illustrates a graph showing the effects of post exposure bake (PEB) temperature and exposure dose on the line edge roughness (LER) of a silicon-containing resist composition according to embodiments of the present invention.

The line edge roughness (LER) of silicon-containing resist compositions of embodiments of the present invention was also studied. In EUV lithography, LER is a key issue, especially as the feature size approaches the size of individual polymer chains, which is about 5 nm for a typical photoresist polymer. Many factors can affect LER, including the resist molecular weight, the molecular weight distribution of the resist, the protecting chemistry, and the processing conditions of the resist. FIG. 10 illustrates the effects of the post-exposure bake (PEB) temperature and exposure dose. The LER in FIG. 10 is represented by 3 sigma of the line edge and can be calculated from SEM images. The dose is represented by the ratio of space/line, wherein the larger the space/line ratio, the higher the dose. FIG. 10 indicates that as the PEB temperature increases from 110° C. to 120° C., both the LER and the dependence of LER on dose decreases.

Figure 11:
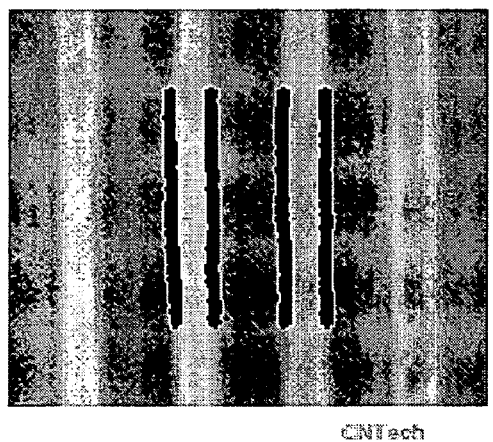
FIG. 11 illustrates an example of the line edges used in a line edge roughness (LER) calculation.

FIG. 11 illustrates a sample of line edges used in determining the LER calculation.

Testing was also performed on some of the boron-containing resist compositions of the present invention. The tests indicate that the inclusion of at least a small amount of boron in a resist composition can help enhance the oxygen etch resistance of a resist composition, making it more effective for EUV lithography applications. In addition, boron-containing resist compositions provide good resolution at 350 nm lines/spaces and below after exposure.

Figure 12:
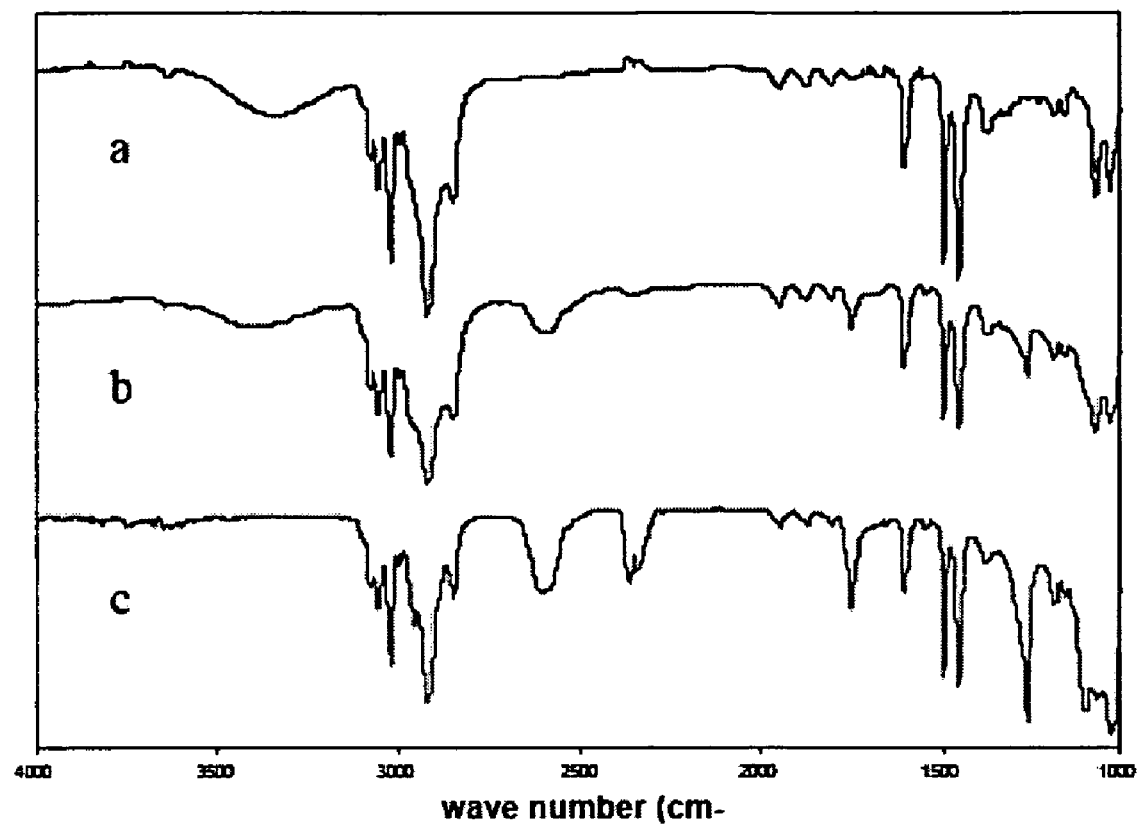
FIG. 12 illustrates FTIR plots of boron-containing resist compositions and block copolymers having different carborane attachments according to embodiments of the present invention.

An FTIR spectral analysis of block copolymers and boron-containing resist compositions according to embodiments of the present invention is illustrated in FIG. 12. The first FTIR plot, designated (a) in FIG. 12, is the spectral analysis of a hydroxylated poly(styrene-b-isoprene) block copolymer from which the boron-containing resists of the present invention may be formed. The second FTIR plot, designated (b) in FIG. 12, is the spectral analysis of a boron-containing resist composition of the present invention wherein only a portion of the hydroxylated sites of the block copolymer have been occupied by a carborane structure. The third FTIR plot, designated (c) in FIG. 12, is the spectral analysis of a boron-containing resist composition of the present invention that is fully attached. The boron-containing resist compositions used for the plots in (b) and (c) of FIG. 12 were formed according to the methods described in Example 9.

An analysis of the FTIR plots of FIG. 12 indicates that with the increase in attachment of carborane, the —OH stretch decreases and disappears. The peak at 2600 cm$^{-1}$ corresponds to the B—H stretching and the peak at 1740 cm$^{-1}$ indicates the presence of a carbonyl group, which links the carborane groups to the polymer backbones. Both of these peaks increase with increased attachment ratio.

Analysis of the oxygen reactive ion etching resistance of the boron-containing resist materials of the present invention was performed and the boron-containing resist compositions of embodiments of the present invention were compared to other boron containing structures. For example, etch resistance of a boron-containing polymer (CHU-B) having the following structure was compared to the etch resistance of the boron-containing resist materials of the present invention.

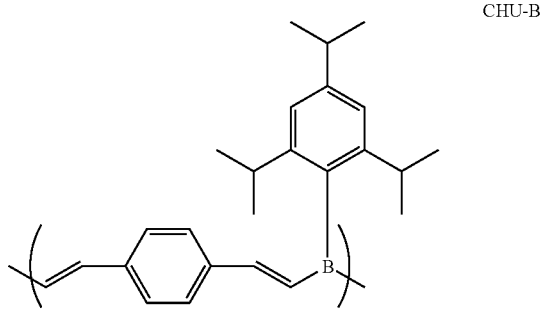

CHU-B

The CHU—B polymer is not a resist material. The etch resistance of Novolac was also compared to the etch resistance of the boron-containing resist materials of the present invention.

Figure 13:
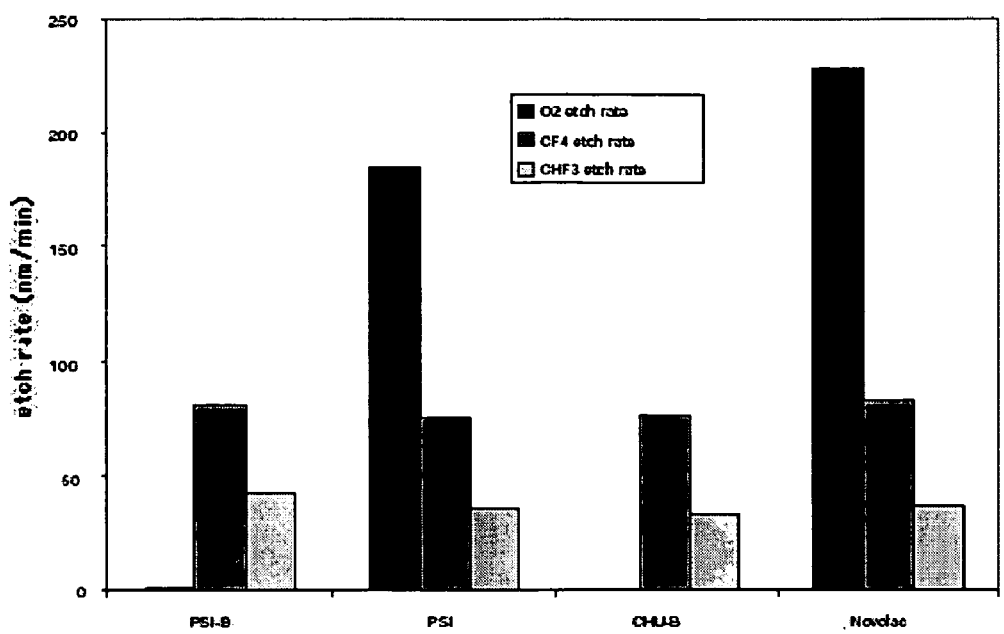
FIG. 13 illustrates an etch rate comparison graph for various boron-containing and non-boron-containing resist polymers.

FIG. 13 illustrates a graph of the etch rates of oxygen ($O_2$) and fluorine-containing organocompounds on the boron-containing resist materials of the present invention, block copolymers used to make the boron-containing resist materials of the present invention, CHU—B, and Novolac. Both of the boron-containing polymers show high oxygen etch resistance, especially when taking into account the fact that less than 1 weight percent boron was incorporated in the boron-containing resist composition formed according to embodiments of the present invention. This indicates that the incorporation of boron into a resist composition increases the oxygen reactive ion etch resistance of the boron-containing resist composition, even if the boron is present at less than 1 weight percent.

In addition to the improved oxygen etch resistance, the boron-containing resist material of the present invention that was subject to the reactive ion etching test had no significant thickness change throughout the etching procedure.

Figure 14:
FIG. 14 illustrates a scanning electron microscope image of a boron-containing resist composition according to embodiments of the present invention.

Boron-containing resist materials according to some embodiments of the present invention were formulated with Powder Link and a photoacid generator to form a negative-tone resist. The negative-tone resist was exposed using a 248 nm stepper and SEM images were obtained. A SEM image of a boron-containing block copolymer with 5 mol percent of free hydroxyl groups is shown in FIG. 14. The 350 nm lines/spaces can be easily distinguished in the SEM image.

Figure 15:
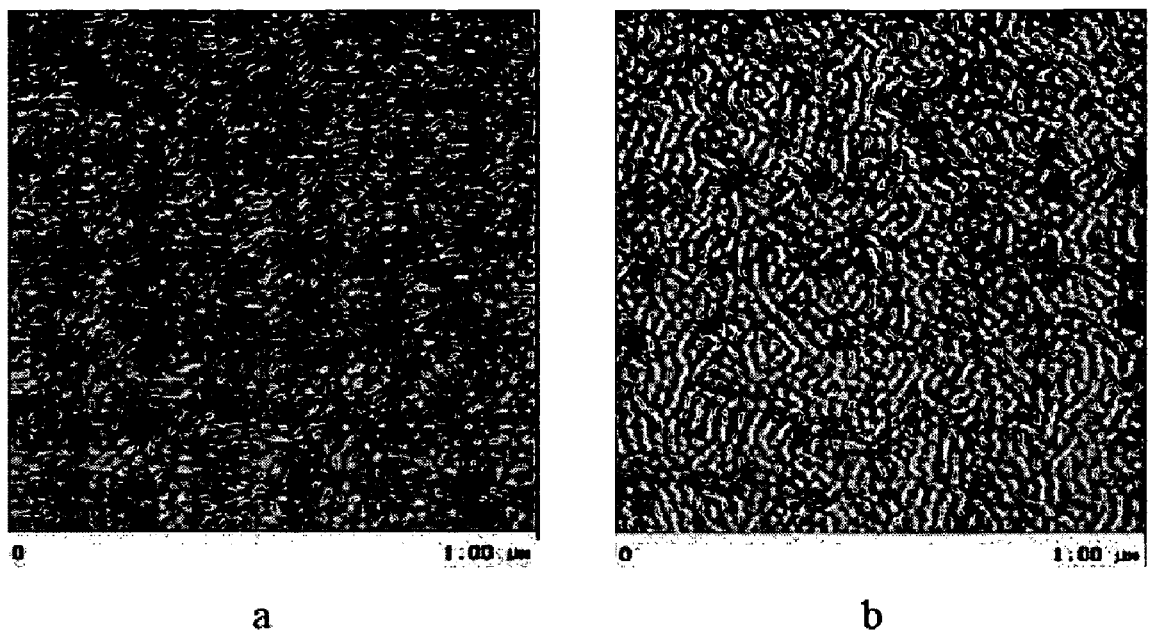
FIG. 15 illustrates AFM images of the cylindrical nanostructures of a boron-containing resist composition according to embodiments of the present invention.
Figure 4:
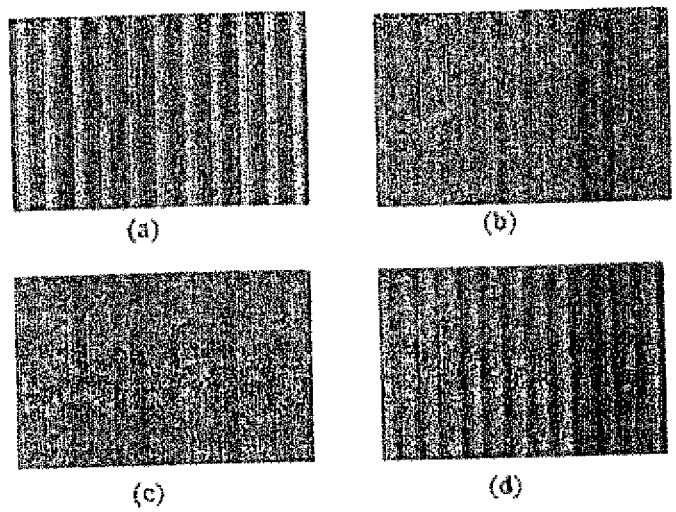
Figure 5:
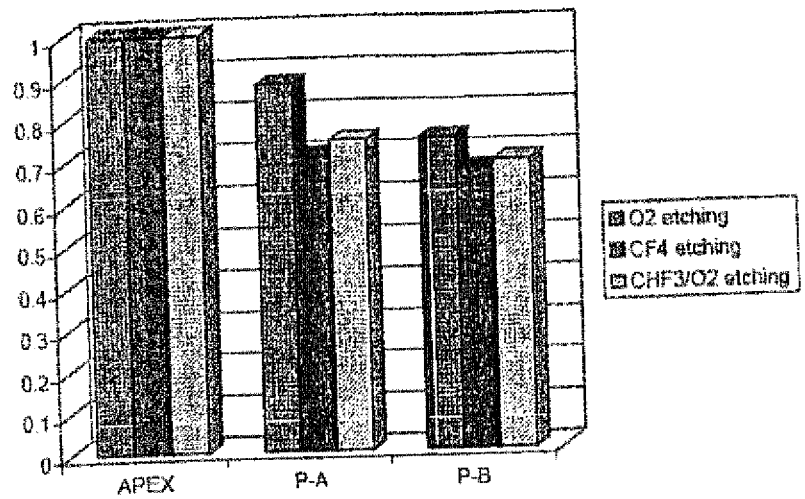
Figure 6:
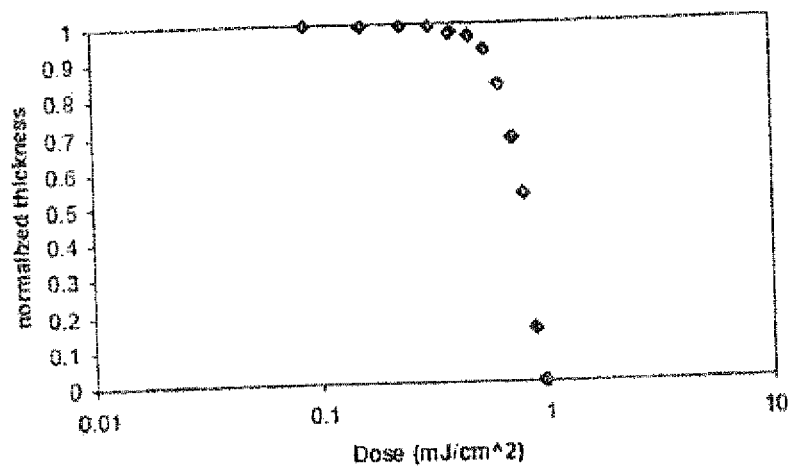
Figure 7:
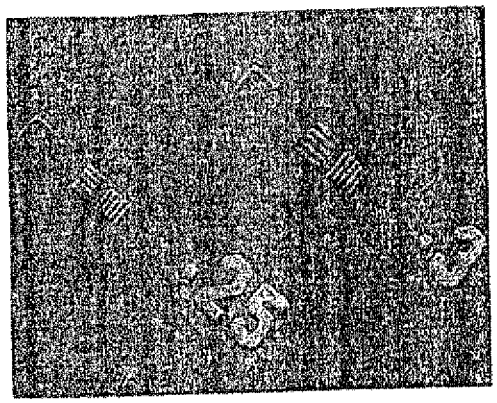
Figure 7:
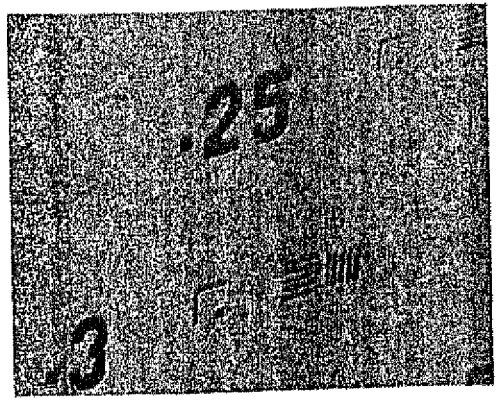
Figure 8:
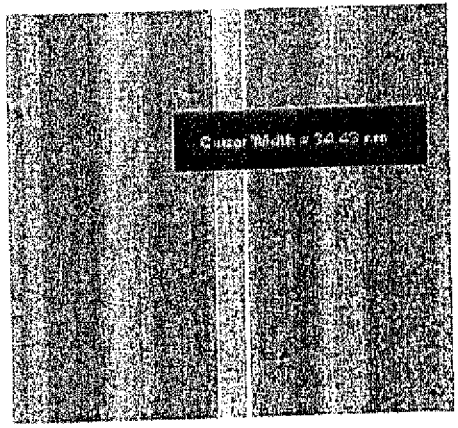
Figure 8:
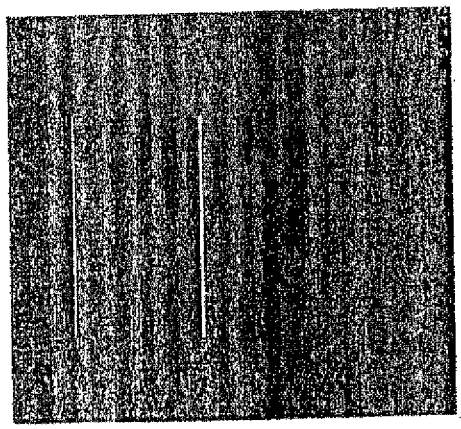
Figure 9:
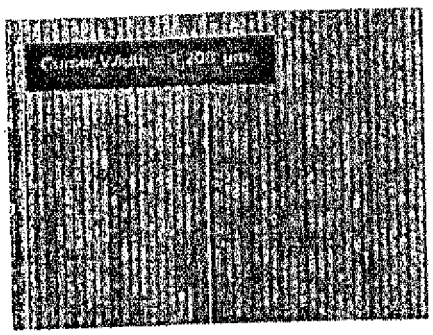
Figure 9:
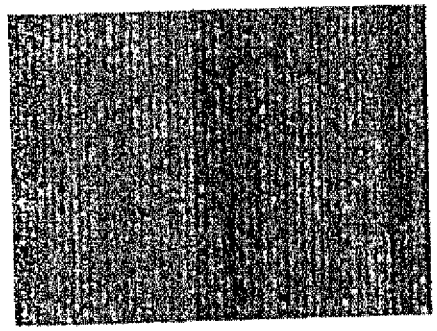
Figure 9:
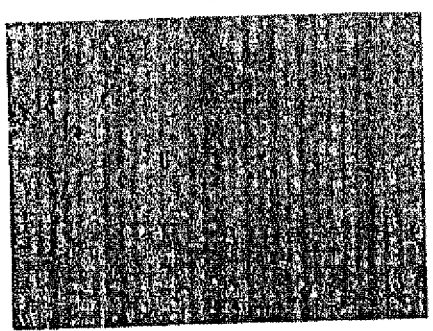
Figure 9:
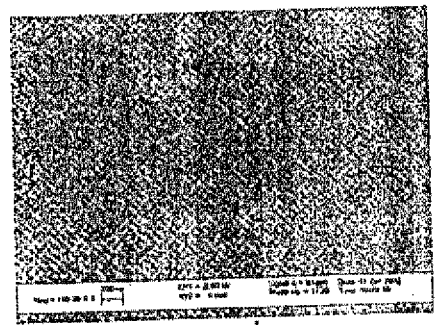
Figure 10:
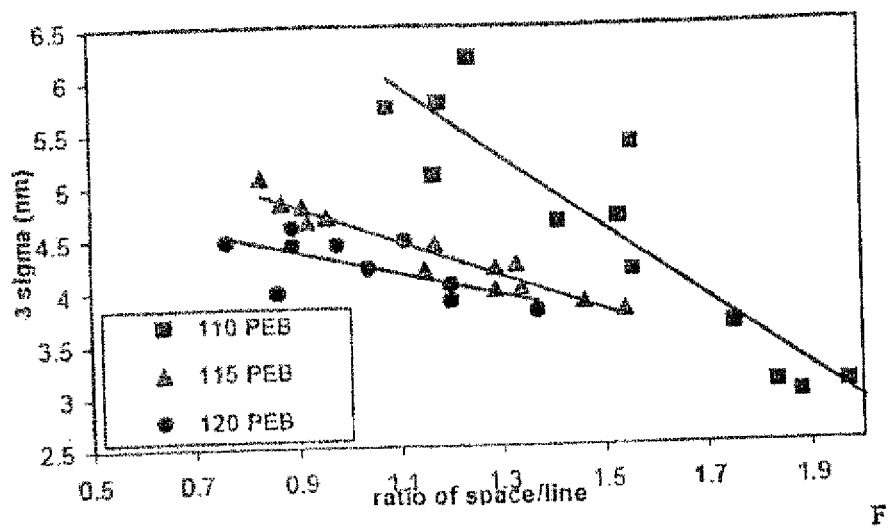
Figure 11:
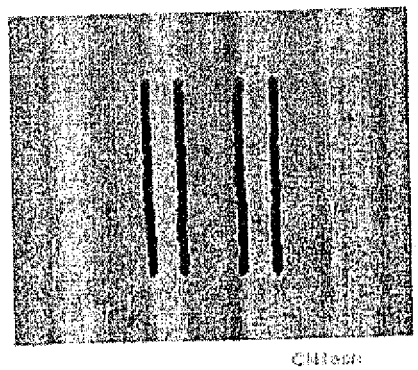
Figure 13:
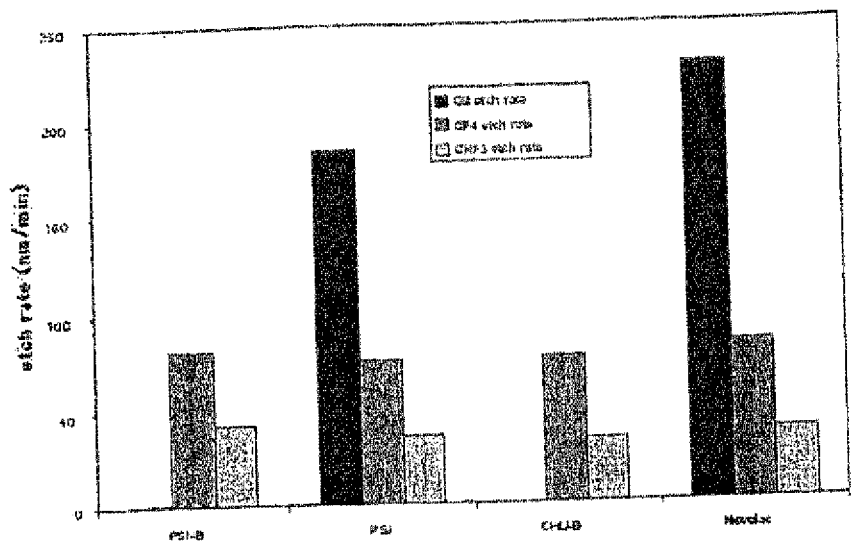
Figure 14:
Figure 15:
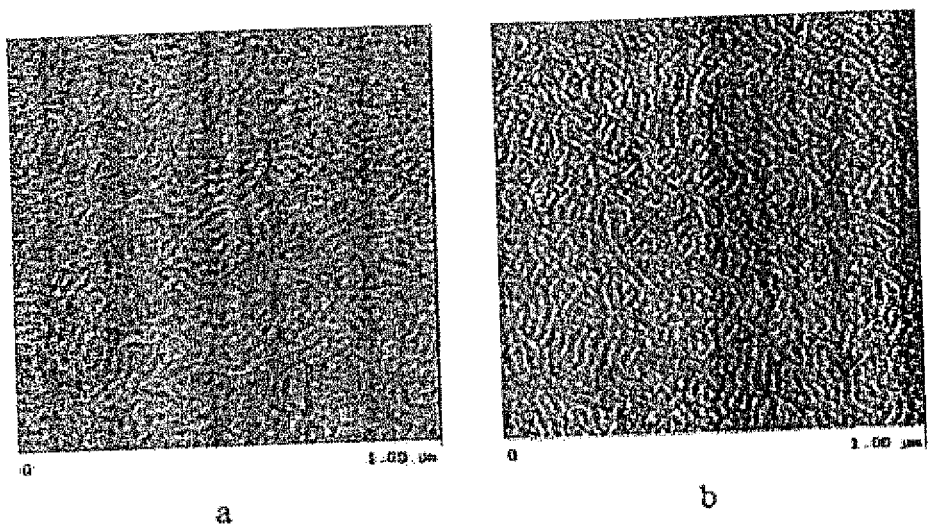

Morphology studies of the boron-containing resist materials have also been performed. FIG. 15 illustrates height contrast and phase contrast AFM images of boron-containing resist materials formed according to the embodiments of the invention described in Example 9. The cylindrical nanostructure of the films formed with the boron-containing resist materials can be viewed in the images.

Silicon-containing and boron-containing resist compositions according to embodiments of the present invention demonstrate improved oxygen etch resistance and high transparency at EUV wavelengths. Silicon-containing resist compositions also exhibit improved etch resistance to other substances such as fluorine-containing compounds. In addition, the boron-containing resist materials may be used for shallow junction doping and the doping of other materials.

Having thus described certain embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A resist composition, comprising a silicon-containing resist polymer, wherein the silicon-containing resist polymer comprises poly(dimethylphenylvinylsilane-b-isoprene) having a molecular weight between about 17,800 and about 22,100.

2. A resist composition, comprising a silicon-containing resist polymer, wherein the silicon-containing resist polymer comprises poly(trimethylsilylstyrene-b-isoprene) having a molecular weight between about 10,700 and about 28,700.

3. A resist composition, comprising a silicon-containing resist polymer, wherein at least a portion of the silicon-containing resist polymer comprises a structure selected from the group consisting of:

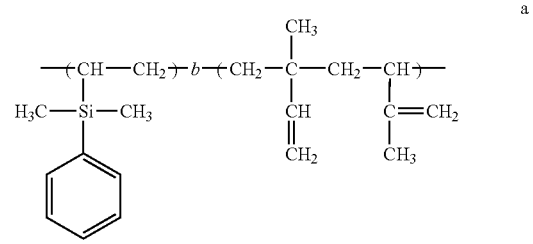

a

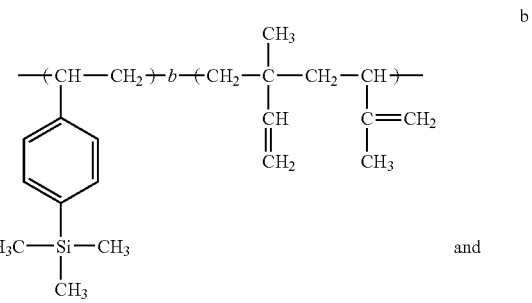

b

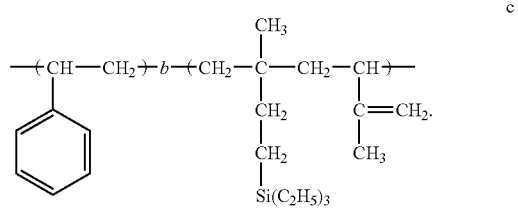

c

4. A resist composition, comprising a silicon-containing resist polymer, wherein at least a portion of the silicon-containing resist polymer comprises a structure selected from the group consisting of

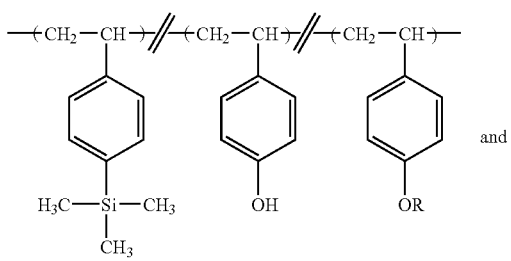

and

-continued

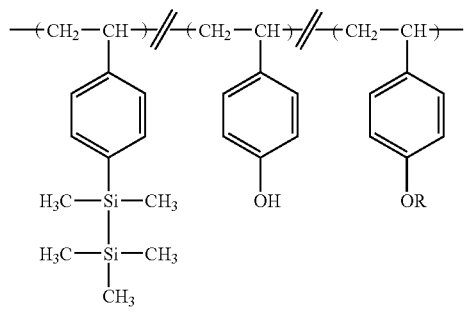

wherein R represents a protecting group.

5. The resist composition of claim 4, wherein the protecting group R is selected from the group consisting of t-butyloxycarbonyl, trimethyl silane, and ethoxymethyl.

6. A resist composition, comprising a boron-containing resist polymer,
wherein the boron-containing resist polymer comprises less than about 1 weight percent boron, and further comprises an element selected from the group consisting of carborane carboxylic acid, dimesitylborane and combinations thereof.

7. A resist composition, comprising a boron-containing polymer, wherein the boron-containing polymer comprises a polymer having the structure:

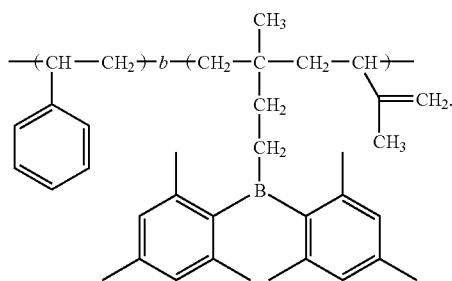

8. The resist composition of claim 7, wherein the resist composition comprises less than about 1 weight percent boron.

9. A resist composition, comprising a boron-containing polymer, wherein the boron-containing polymer comprises a polymer having the structure:

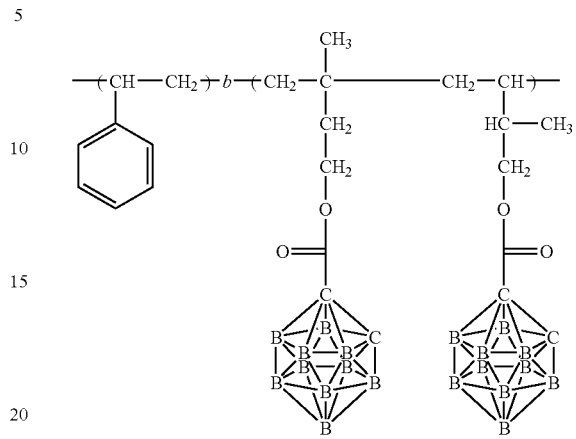

10. A resist composition, comprising a boron-containing polymer, wherein the boron-containing polymer comprises a boron-containing polymer having the structure:

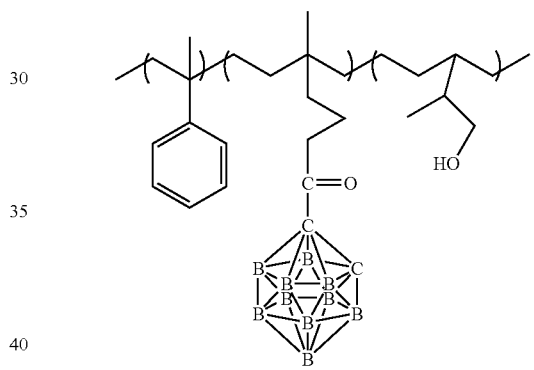

11. A method for forming a boron-containing resist polymer, comprising performing a hydroboration or esterification reaction of a boron-containing group with a polymer, wherein the polymer comprises a polymer selected from the group consisting of poly(styrene-b-isoprene) and hydroxylated poly(styrene-b-isoprene), to introduce dimesitylborane or a carborane into the polymer.

* * * * *

UNITED STATES PATENT AND TRADEMARK OFFICE
CERTIFICATE OF CORRECTION

PATENT NO.         : 7,326,514 B2
APPLICATION NO. : 10/800195
DATED                 : February 5, 2008
INVENTOR(S)       : Dai et al.

It is certified that error appears in the above-identified patent and that said Letters Patent is hereby corrected as shown below:

In the Drawings:
Please replace the following:
  Fig. 4 (a), (b), (c) and (d)
  Fig. 5
  Fig. 7 a and b
  Fig. 8 a and b
  Fig. 9 a, b, c and d
  Fig. 11
  Fig. 13
  Fig. 14
  Fig. 15 a & b Signed and Sealed this Fifth Day of January, 2010

David J. Kappos
*Director of the United States Patent and Trademark Office*